United States Patent [19]

Benzing et al.

[11] Patent Number: 5,527,654
[45] Date of Patent: Jun. 18, 1996

[54] PROCESS FOR THE PRODUCTION OF A COLOR IMAGE UTILIZING TRANSFERRED WHITE PIGMENT LAYER

[75] Inventors: Martin Benzing, Biebelnheim; Dieter Mohr, Appenheim; Juergen Mertes, Ingelheim; Peter Blum, Kronberg, all of Germany

[73] Assignee: Hoechst Aktiengesellschaft, Frankfurt, Germany

[21] Appl. No.: 276,798

[22] Filed: Jul. 18, 1994

[30] Foreign Application Priority Data

Jul. 30, 1993 [DE] Germany .......................... 43 25 684.8

[51] Int. Cl.⁶ .................................. G03F 7/34; G03F 7/30
[52] U.S. Cl. ...................... 430/143; 430/253; 430/254; 430/257; 430/293; 430/294
[58] Field of Search ..................................... 430/143, 253, 430/254, 257, 293, 294

[56] References Cited

U.S. PATENT DOCUMENTS

| | | | |
|---|---|---|---|
| 4,260,673 | 4/1981 | Krech | 430/143 |
| 4,262,071 | 4/1981 | Larson | 430/11 |
| 4,650,738 | 3/1987 | Platzer et al. | 430/143 |
| 4,656,114 | 4/1987 | Cederberg et al. | 430/160 |
| 4,659,642 | 4/1987 | Platzer et al. | 430/143 |
| 4,734,356 | 3/1988 | Bauer et al. | 430/293 |
| 4,889,787 | 12/1989 | Musser | 430/166 |
| 4,895,787 | 1/1990 | Platzer | 430/253 |
| 5,049,476 | 9/1991 | Platzer | 430/253 |
| 5,348,833 | 9/1994 | Mohr et al. | 430/143 |

FOREIGN PATENT DOCUMENTS

| | | |
|---|---|---|
| 305599 | 3/1989 | European Pat. Off. . |
| 420675 | 4/1991 | European Pat. Off. . |

*Primary Examiner*—Charles L. Bowers, Jr.
*Assistant Examiner*—Christopher G. Young
*Attorney, Agent, or Firm*—Foley & Lardner

[57] ABSTRACT

A process for the production of a color image is described, in which a photosensitive material that has a temporary support film, a colored photosensitive layer and an adhesion-promoting layer that can be activated by heat is laminated at high temperature and under pressure with an image-receiving material which carries, on a support, a pigment layer containing a white pigment. The photosensitive layer is exposed imagewise and developed to produce an image, the temporary support film is peeled off from the image-receiving material before or after exposure to light and, if required, these steps are repeated with at least one further photosensitive material whose colored layer has another color to produce a multi-colored image. The process gives color images having a smaller dot enlargement compared with a halftone original and is particularly suitable for the color testing of copy for multicolor printing.

11 Claims, No Drawings

PROCESS FOR THE PRODUCTION OF A COLOR IMAGE UTILIZING TRANSFERRED WHITE PIGMENT LAYER

BACKGROUND OF THE INVENTION

1. Field of the Invention

The invention relates to a process for the production of a color image, in particular for the color testing of originals for multicolor printing. The invention further relates to a layer material that is suitable for carrying out the process and to a color image, in particular a multicolor image, which is obtained by the process.

2. Description of Related Art

In multicolor printing, a color test generally is carried out to permit the correction of the color separations used for the exposure of printing plates. The color proof must be a true image of the desired halftone or line image and should reproduce the tonal value of the colors faithfully and as far as possible identically to the subsequent printed image. The visual color test should indicate errors in the original, make it possible to recognize the best color reproduction to be expected during printing on the press, reproduce the exact gradation of all hues and show whether the gray tints are neutral. They should furthermore indicate the necessity of reducing one of the colors and/or provide information regarding any change to the photographic transparency prior to production of the printing plates.

In this color test, images typically are produced in succession in primary colors, according to the primary colors of the multicolor print, on an image-receiving material and then transferred to this material so that the in-register superposed images in primary colors give a faithful multicolor image.

The primary color images can be produced, inter alia, by exposing and washing out a finished photosensitive layer, by exposing and peeling apart the support film and cover film of a layer material having a photosensitive layer in between, the exposed parts of the layer adhering to one film and the unexposed parts to the other film, (peel-apart process), or by treating a developed colorless image with a toner or with ink. In general, diazo compounds or photopolymerizable mixtures are used as photosensitive components.

For the production of a multicolor image from individual images in primary colors, it has proven particularly suitable to laminate the photosensitive layers for the individual colors in succession with an image-receiving material, to expose them there and to develop them to give the image in primary color. This procedure is preferred to the possibility of producing each image in primary color separately and transferring the images in primary colors in succession to the image-receiving material. The latter case requires lamination in register, which is very much more difficult to effect in terms of apparatus than exposure in register.

U.S. Pate. Nos. 4,260,673, 4,650,738, 4,656,114 and 4,659,642, and EP-A 447 829 describe photosensitive materials based on diazo compounds for the production of color proofing films, which are processed in a manner such that the unexposed photosensitive layer is first laminated with the image-receiving material and then exposed in register and developed by washing out. U.S. Pat. Nos. 4,895,787 and 5,049,476 describe color proofing methods in which photosensitive color layers are likewise transferred to an image-receiving material, exposed there and developed. These materials are based on photopolymerizable mixtures and are developed by the "peel-apart" technique.

All these materials with which multicolor images are produced from images in primary colors by combination in register contain release layers and/or adhesion-promoting layers which remain between the individual images in primary colors in the finished multicolor image. However, these colorless intermediate layers cause optical magnification of the individual image elements, i.e. of the halftone dots in halftone images, which generally is referred to as optical dot enlargement. This optical dot enlargement is entirely desirable and necessary in order to approximately simulate the dot enlargement which, in offset printing, may be in the range of about 8–30% compared with the original. The dot enlargement in the color proof can be controlled within certain limits by increasing or reducing the layer weight of the release and adhesion-promoting layers. Thus, for example, U.S. Pat. No. 4,262,071 describes the introduction of a spacer layer for increasing the dot enlargement.

The adjustment of dot enlargements in the higher range can be readily effected by the known methods. It is substantially more difficult to adjust enlargements in the range from 8 to 20%, i.e. to reduce the enlargement occurring in the uncorrected color image. EP-A 305 599 describes the reduction by the use of a support material which has a coating with $TiO_2$. Another method of reduction is described in U.S. Pat. No. 4,734,356. There, positive-working color proofing films which are based on photopolymerizable mixtures containing optical brighteners are rendered visible by treatment with a toner. U.S. Pat. No. 4,889,787 describes photosensitive color proofing films which contain very thin adhesion-promoting layers (1.0 to 3.2 $g/m^2$) and thus give very small dot enlargements. However, the processing requires relatively high lamination temperatures and low lamination speeds.

EP-A 420 675 describes a color proofing method in which $TiO_2$ is added to the adhesion-promoting layer of the color proofing film, which is the first to be laminated with the receiving material. This adhesion-promoting layer is substantially thicker than those in the other films.

This method requires that the image is always built up starting with the same primary color, i.e. the color film which carries the thick pigmented adhesion-promoting layer. Furthermore, only a slight reduction in the dot enlargement is achieved.

Thus, there exists a need to provide a process for the production of color images, in particular multicolor images, in which the dot enlargement in the proof can be reduced to the desired extent and in which image defects caused by dust particles on the surface of the layer to be transferred can be avoided during processing by the peel-apart method.

SUMMARY OF THE INVENTION

It is therefore an object of the present invention to provide a process for the production of color images wherein the dot enlargement in the proof can be reduced to the desired extent and in which image defects caused by dust particles on the surface of the layer to be transferred are avoided during processing by the peel-apart method.

It is an additional object of the present invention to provide a layer material useful in carrying out the aforementioned process and a color image prepared by the aforementioned process where the dot enlargement of the color image has been reduced to the desired extent and image defects are avoided.

In accordance with this and other objects of the present invention, there is provided a method for the production of a color image wherein a photosensitive material that has a temporary support film, a colored photosensitive layer and an adhesion-promoting layer that can be activated by heat, is laminated at high temperature and under pressure with an image-receiving material that carries on a support, a pigment layer containing a white pigment. The colored photosensitive layer then is exposed imagewise and developed to give the image, and the temporary support film is peeled off from the image-receiving material before or after exposure to light and, if required, these steps are repeated with at least one further photosensitive material whose colored layer has another color.

The process according to the invention utilizes an image-receiving material which carries, on a support, a pigment layer containing a white pigment.

In accordance with an additional object of the invention, there is provided a layer material which is suitable for carrying out the process and has a sheet-like support and a pigment layer which contains a white pigment and, preferably, a polymeric binder.

In accordance with another object of the invention, there is provided a color image, in particular a multicolor image, having a support, at least one adhesion-promoting layer which can be activated by heat and at least one image layer obtained by imagewise exposure and development of a colored photosensitive layer, wherein a pigment layer comprising a white pigment and, preferably, a polymeric binder is arranged between the adhesion-promoting layer and the support.

These and other objects of the invention will become readily apparent to those skilled in the art upon review of the detailed description that follows.

DETAILED DESCRIPTION OF THE PREFERRED EMBODIMENTS

In the process according to the invention, the color image is preferably produced by exposing the photosensitive layer before the temporary support film is peeled off, and developing the image by peeling apart the temporary support film and the image-receiving material.

In another embodiment of the process of the present invention, the temporary support film first is peeled off from the photosensitive layer and the image then is developed by washing out the exposed photosensitive layer with a developer.

In this embodiment, the temporary support film preferably is peeled off before exposure to achieve better image resolution. However, if desired, when the photosensitive layer has a tendency to be tacky, the exposure may also be carried out, as in the first embodiment described, through the temporary support film before the temporary support film has been peeled off.

An important feature of the process according to the present invention is that an image-receiving material modified in a particular manner by the colorless or white pigment layer is used. The pigment layer contains a white, finely divided, insoluble, in particular inorganic pigment. Particularly suitable pigments are the oxides, sulfides, sulfates or carbonates of metals of the 2nd or 4th main group (IIA or IVA) or of the 2nd or 4th subgroup IIB or IVB of the Periodic Table, provided that they have the above-mentioned properties. Therefore, examples of suitable pigments include $CaCO_3$, $BASO_4$, $SrCO_3$, $MgO$, $ZnS$, $ZnO$, $SiO_2$ and $TiO_2$. Titanium dioxide is particularly preferred. The mean particle size of the pigment is in general 0.1 to 100, preferably 0.3 to 30 µm. The amount of the pigment in the pigment layer is an amount sufficient to provide the necessary color, which is usually at least 10% by weight. In general, it is between 10 and 95, preferably between 35 and 80% by weight.

The layer preferably furthermore contains an organic polymer as a binder. The polymeric binder should have sufficient film-forming capability, should be compatible with the pigment and should be soluble in a suitable coating solvent. The binder preferably is colorless and insensitive to atmospheric oxygen and to any processing solutions to be used; in particular, it should not yellow on prolonged storage in light and in the air. If the material is to be developed by washing out, the binder should be insoluble in the developer; if the development is effected by peeling apart, it should exhibit virtually no softening or tack at the temperature prevailing during this procedure.

Suitable binders include any having these desired characteristics, including long-oil, medium-fat and short-oil alkyd resins, styrene- or vinyltoluene-modified alkyd resins or silicone alkyd resins, two-component polyurethanes, polyesters, vinyl polymers, vinyl acrylate polymers, acrylic resins, nitrocelluloses, cellulose esters, e.g. cellulose acetopropionate or cellulose acetobutyrate, two-component epoxy resins, epoxy resin esters, alkyd/melamine resins, phenol resins, e.g. novolaks or similar resins, polyvinyl acetates and copolymers of the monomers forming these polymers.

The pigment layer may furthermore contain dyes or colored pigments in small amounts in order, if desired, to simulate the coloring of a printing paper to be used or in order to compensate any yellowing of the color test material. The weight of the pigment layer is in general in the range of from 0.3 to 70, preferably of 2 to 20 $g/m^2$.

The pigment layer may be applied to the image-receiving material in any technologically suitable manner, for example, by extrusion, by coating from a suitable solvent, by spraying of a dispersion or by transfer of a prefabricated layer under pressure and heat. If, as is frequently the case, the image-receiving material is a paper, transfer by lamination has proven particularly suitable. For this purpose, a pigment layer of the desired composition and thickness is produced on a temporary support film by coating and drying and is transferred to the image-receiving material by lamination and peeling off of the support film. For better anchoring of the pigment layer, it may be advantageous to apply to the pigment layer an adhesion-promoting layer, as usually used in the transfer of color layers. The temporary support films used are likewise those which are usually used in the transfer of color layers or color images.

The surface of the support film on which the pigment layer is present is permitted to have only limited adhesive power, so that the bond can be broken. For example, polyester films having thicknesses in the range from 10 to 250, preferably 20 to 100 µm are suitable. Any adhesion-promoting layer also applied has essentially the same composition and characteristics as the adhesion-promoting layers used in the case of known color proofing films, i.e. it is nontacky at room temperature and has a softening point below 160° C. preferably below 100° C. It generally has a layer weight of 2 to 40, preferably 8 to 25 $g/m^2$ when dry. The adhesion promoting layer also is generally applied to the pigment layer from a solvent which dissolves this layer as little as possible.

The pigment layers useful in the process according to the invention can be employed in a variety of color proofing methods. Thus, it is possible in principle to produce the color proofs by transfer of primary color layers, exposure and development, by transfer of finished images in primary colors, by visualization of developed progressive images by treatment with toner or ink and the like. Materials and processes of this type are known and are described, for example, in all of the publications stated at the outset, the disclosures of which are incorporated by references herein in their entirety. The process according to the invention also is suitable for the production of one-color images in any hues when exact simulation of the percent dot area of an original is important in the case of said images. It is particularly advantageously used in color proofing methods in which the image is built up by transfer of primary color layers to an image-receiving material, exposure and development to give the image in primary colors and repetition of these steps. The development can be carried out by washing out or, preferably, by peeling apart.

This process and suitable materials therefor are described in EP-A 352 055, U.S. Pat. Nos. 4,895,787 and 5,049,476 and EP-A 525 624, the disclosures of which are incorporated by reference herein in their entirety.

In a preferred embodiment of the process according to the present invention, a layer material first is produced from a temporary support film, a white pigment layer and preferably an adhesion-promoting layer and is laminated with a customary image-receiving material, e.g. a printing paper. The support film is peeled off, and the color proof is built up in the customary manner on the exposed pigment layer. This preferably is done by lamination with an unexposed color proofing film which carries, on a temporary support, a photosensitive color layer, preferably a photopolymerizable layer, and an adhesion-promoting layer. The photosensitive layer is exposed through the support film, under an original, and the image is developed by peeling apart the support film and the image-receiving sheet, the exposed parts of the layer, in the case of a negative-working layer, being removed with the support film and the unexposed parts remaining behind on the image-receiving material as a positive image in primary colors. The color proofing film of the next primary color is laminated with this first image in primary colors, exposed there in register with the first image and developed in the same way as the latter. The complete multicolor image is finally obtained in this manner.

The image-receiving material used in the process according to the invention is a sheet-like material which is dimensionally stable under the processing conditions. It may be composed of plastic films, plastic-coated special paper or standard printing paper. Either white or non-white receiving materials may also be used, for example metal foils or glass. By using the white pigment layer according to the invention, it also is possible to use papers which have not been highly treated and otherwise cannot be used for color test purposes. Lamination is advantageously effected in an apparatus intended for this purpose, under pressure and at high temperature. The lamination temperature usually is in the range of from 60° to 170° C. preferably between 70° and 130° C.

As mentioned above, the adhesion-promoting layer of the color proofing film can be applied from a solvent or solvent mixture, which does not dissolve the photosensitive, preferably photopolymerizable color layer, directly to the color layer, and can be dried. It may first also be applied to a temporary support film and transferred from there to the color layer by lamination and peeling off of the support film. Direct application from solvents to this layer is preferred. Suitable solvents which do not dissolve the color layer are water and saturated hydrocarbons. Many polymers useful in the adhesion-promoting layer of the invention can be applied from aqueous dispersion; however, application from solution is preferred. For example, salts of polymers having acid groups, e.g. carboxyl groups, are suitable for this purpose. A preferred example is an aqueous alkaline solution of a vinyl acetate/crotonic acid copolymer (®Mowilith Ct 5). Other suitable polymers are polyvinyl acetate dispersions or polyacrylate dispersions. The polymers should have a softening temperature in the range of from 40° to 200° C., preferably from 60° to 120° C., and should preferably have a glass-transition temperature (Tg) in the range of from 20° to 60° C. In addition to the thermoplastic polymer, the adhesion-promoting layer may also contain plasticizers, residual solvents, surface leveling agents, lubricants, antistatic agents, optical brighteners and/or UV absorbers. Its layer weight in the dry state is usually 2 to 40, preferably 8 to 25 g/m$^2$.

The photosensitive layer used is preferably a photopolymerizable layer. It contains, as essential components, a polymeric binder, a compound capable of undergoing free radical polymerization, a photoinitiator and a dye or a colored pigment, in general in a primary color of the multicolor print. Examples of photopolymerizable layers of this general composition are described in U.S. Pat. No. 4,895,787, the disclosure of which is incorporated by reference herein in its entirety.

Suitable photoinitiators are essentially any compound or combination of compounds which are known for this purpose. Examples include benzoin ethers, benzil ketals, polynuclear quinones, benzophenone derivatives, triarylimidazolyl dimers and photosensitive trihalomethyl compounds, e.g. trichloromethyl-s-triazines. 2,3-Bisarylquinoxalines, as described in U.S. Pat. No. 3,765,898, and 2-aryl-4,6-bistrichloromethyl-s-triazines are preferred. The amount of photoinitiator or of photoinitiator combination is in general between 1 and 25, preferably between 5 and 15% by weight, based on the weight of the dry layer.

The polymeric binder should impart homogeneity and strength to the layer. Suitable binders are styrene/maleic anhydride and styrene/maleic half-ester copolymers, acrylate polymers and acrylate copolymers, polyamides, polyvinylpyrrolidones, cellulose-derivatives, such as cellulose esters and cellulose ethers, phenol resins, polyvinyl esters, polyvinylacetals, e.g. polyvinylbutyral, polyvinylpropional or polyvinylformal. The amount of the binder is in general 15 to 70, preferably 20 to 50% by weight, based on the weight of the solid layer.

The polymerizable compound contains at least one, preferably at least two, terminal double bonds capable of undergoing free radical polymerization and is not gaseous at temperatures below 100° C. and at atmospheric pressure. Esters and amides of acrylic and methacrylic acid are preferred. In particular, the esters with polyhydric alcohols are advantageously used. Examples are di-, tri-, tetra- and polyethylene glycol di(meth)acrylate, the di(meth)acrylates of oligo- and polypropylene glycols, 1,4-butanediol di(meth)acrylate, trimethylolpropane di- and tri(meth)acrylate, trimethylolethane di- and tri(meth)acrylate, pentaerythritol tri- and tetraacrylate or tri- and tetramethacrylate, and dipentaerythritol tetra-, penta- and hexa(meth)acrylate. The amount of polymerizable compound is in general 15 to 70, preferably 20 to 60% by weight.

The dyes or colored pigments preferably are chosen so that they correspond to the primary colors of the multicolor print, cyan (bluish green); magenta (purple); yellow and black. Pigments are generally preferred. Examples are Permanent Yellow G (C.I. 21 095), Permanent Yellow GR (C.I. 21 100), Permanent Yellow DHG (C.I. 21 090), Permanent Ruby L6B (C.I. 15 850: 1), Permanent Pink F3B (C.I. 12

433), ®Hostaperm Pink E (C.I. 73 915), ®Hostaperm Reddish Violet ER (C.I. 46 500), Permanent Carmine FBB (C.I. 12 485), ®Hostaperm Blue B2G (C.I. 74 160), ®Hostaperm Blue A2R (C.I. 74 160) and ®Printex 25 (carbon black). These pigments all are commercially available and readily usable by those skilled in the art. The pigments can, if required, be mixed in order to achieve the desired hue. Any other hues, e.g. gold, silver, bronze, etc., may also be produced. The inorganic or organic pigments are generally dispersed or made into a paste together with a part of the binder in a suitable solvent. The mean particle size is in general below 1 μm. The amount of the dye or pigment is in general 8 to 40, preferably 12 to 30% by weight.

The photopolymerizable layer can, if required, contain further components, such as hydrogen donors, sensitizers, polymerization inhibitors, plasticizers, residual solvents, surfactants, surface leveling agents, lubricants, antistatic agents, inert fillers, optical brighteners and/or UV absorbers. It has in general a layer weight of 0.2 to 5, preferably 0.3 to 3, g/m². Those skilled in the art are capable of fabricating a suitable photopolymerizable layer for use in the present invention in accordance with the guidelines presented herein.

The support films used are transparent, flexible, dimensionally stable films of plastics, e.g. polyesters, polycarbonates, etc. Polyester films, in particular, biaxially oriented and heat-set films, for example, of polyethylene terephthalate, are particularly preferred. These should remain dimensionally stable at the required lamination temperatures, i.e. from about 60° to 150° C. Their thickness is in general 10 to 200, preferably 25 to 80, μm. The support film advantageously is pretreated with an adhesion promoter on one or both sides and may have a smooth or a rough or matt surface, preferably a smooth surface.

As a result of the use of the material and process according to the invention, the color proof has a smaller dot enlargement or a smaller percent dot area in the halftone image than a corresponding image which has been produced using a material without the white pigment layer used according to the invention. Furthermore, image defects which are formed as a result of image parts of the color layer being torn off and which may be due to dust occlusions or blistering during lamination are substantially suppressed. Compared with the process of EP-A 420 675, in which TiO₂ is added to the adhesion-promoting layer of the first color proofing film, the process according to the invention gives substantially smaller dot enlargement. The disclosures of all of the documents discussed herein are incorporated by reference herein in their entirety.

The examples which follow illustrate preferred embodiments of the invention. Amounts are generally stated in parts by weight; percentages and ratios are to be understood as weight units, unless stated otherwise.

EXAMPLE 1

Preparation of Image-receiving Material

A pigment layer (white layer) which had a dry weight of about 8 g/m² was applied to a 50 μm thick film of polyethylene terephthalate as a temporary support. The following coating solution was applied by means of a knife coater and dried at 100° C. in a drying oven for 2 minutes:

50 parts by weight of a TiO₂ pigment surface-modified with an acrylate polymer and having a mean particle size of 0.7 μm and 50 parts by weight of 1-methoxyprop-2-yl acetate.

In the following step, an adhesion-promoting layer having a dry weight of about 6 g/m² was applied to the pigment layer by coating with the following solution:

15 parts by weight of a copolymer of 95% of vinyl acetate and 5% of crotonic acid, 17 parts by weight of ethanol, 67 parts by weight of water (demineralized) and 1 part by weight of ammonia solution (25% strength in water).

Preparation of Photosensitive Material

Four photosensitive materials for the production of color proofing films were prepared. For this purpose, four coating solutions in the primary colors cyan, yellow, magenta and black, having the composition (in parts by weight) shown in the table below, were each applied to a 50 μm thick film of biaxially oriented and heat-set polyethylene terephthalate, whose surface had been pretreated for adhesion promotion, and were dried:

TABLE 1

| Component | Cyan | Yellow | Magenta | Black |
|---|---|---|---|---|
| Tetrahydrofuran | 200 | 200 | 200 | 200 |
| 4-Hydroxy-4-methyl-2-pentanone | 150 | 150 | 150 | 150 |
| 1-Methoxy-2-propanol | 444 | 465 | 489 | 490 |
| γ-Butyrolactone | 44 | 65 | 89 | 90 |
| Polyvinyl formal ($\bar{M}$ = 80,000; 24% of vinyl alcohol units, 26% of vinyl acetate units and 50% of vinylformal units) | 6 | 13 | 18 | 9 |
| Dipentaerythritol pentaacrylate | 8 | 12 | 8 | 12 |
| 2,3-Bis(4-methoxyphenyl)-quinoxaline | 4 | 4 | 4 | 4 |
| ® Hostaperm Blue B2G (C.I. 74160) | 7 | — | — | — |
| Permanent Yellow GR (C.I. 21100) | — | 7 | — | — |
| Permanent Carmine FBB (C.I. 12485) | — | — | 12 | — |
| Carbon black (® Printex 25) | | | | |

The pigments were dispersed together with a part of the binder and of the solvents. They were then milled to a mean diameter of less than 0.2 μm and added to the remainder of the solution. A solution of 78 parts by weight of n-butyl acetate, 1 part by weight of polymeric plasticizer (®Resoflex R 296) and 21 parts by weight of polyvinyl acetate (MW 110,000; Tg 28° C.)

was applied to similar polyester films, which however had not been pretreated for adhesion promotion, and was dried. The dry layer had a weight of 12 g/m². A film with the adhesion-promoting layer was laminated with each of the four photosensitive films, and the support film of the adhesion-promoting layer was then peeled off.

The dried layer image-receiving material provided with the white layer was processed as follows:

1. Lamination of the image-receiving material, using a pressure of about 300 kPa, with a special paper having good wet strength and coated on both sides with polyethylene.

2. Peeling off of the temporary support of the image-receiving material, with the result that the pigmented layer was exposed.

3. Lamination of the first color photosensitive film (cyan) with the exposed pigment layer.
4. Exposure to actinic light under an appropriate color separation film.
5. Peeling off of the polyester support film, the nonimage parts being removed with the film.
6. Repetition of steps 3 to 5 with the remaining colors, i.e. magenta, yellow and black.

The percent dot area was measured using a commercial reflected-light densitometer (D 186 from Gretag). Those skilled in the art are capable of measuring the percent dot area using this densitometer.

Table 2 shows the dot enlargement in % in the 40% field of the Ugra test wedge (60-line screen), in the case of color proofs with and without a white layer (W), which were produced on various image-receiving materials (Ozasol® TF 01 and TF 03), exposed to different tonal value reproductions. TF 01 is a pure white special paper, and TF 03 is a special paper colored light gray to simulate customary newsprint.

TABLE 2

| Support material | Resolving power | Dot enlargement beyond 40% (% absolute) | | | |
|---|---|---|---|---|---|
| | | Cyan | Magenta | Yellow | Black |
| TF 01 | 2–97% | 21 | 22 | 19 | 24 |
| TF 01 + W | 2–97% | 17 | 19 | 16 | 21 |
| TF 01 | 2–97% | 22 | 18 | 17 | 23 |
| TF 01 + W | 2–97% | 18 | 16 | 14 | 19 |
| TF 01 | 2–97% | 21 | 19 | 19 | 21 |
| TF 01 + W | 2–97% | 17 | 16 | 16 | 18 |
| TF 01 | 2–97% | 18 | 17 | 16 | 20 |
| TF 01 + W | 2–97% | 14 | 15 | 15 | 17 |

EXAMPLE 2

The procedure of Example 1 was followed, except that a pigment layer solution having the following composition was used:

35 parts by weight of the $TiO_2$ pigment stated in Example 1, 15 parts by weight of polypyrocatechol mono-methacrylate, 30 parts by weight of tetrahydrofuran and 20 parts by weight of 1-methoxyprop-2-yl acetate.

The results obtained with this material corresponded essentially to the results listed in Table 2. The polymer added had no effect on the dot enlargement.

EXAMPLE 3

The procedure of Example 1 was followed, except that a pigment layer solution having the following composition was used:

40 parts by weight of the $TiO_2$ pigment as stated in Example 1, 10 parts by weight of a cresol/formaldehyde novolak having a melting range of 120°–135° C. and 50 parts by weight of butanone.

The results obtained with this material corresponded essentially to those of Table 2. The novolak had no effect on the dot enlargement.

EXAMPLE 4

The procedure of Example 1 was followed, except that a pigment layer solution having the following composition was used:

24 parts by weight of the $TiO_2$ pigment stated in Example 1, 6 parts by weight of polyvinylformal as in Example 1, 55 parts by weight of tetrahydrofuran and 15 parts by weight of 1-methoxy-2-propanol.

The results obtained with this material corresponded essentially to those in Table 2. The polymer added had no effect on the dot enlargement.

EXAMPLE 5

The procedure of Example 1 was followed, except that a pigment layer solution having the following composition was used:

24 parts by weight of the $TiO_2$ pigment stated in Example 1, 6 parts by weight of polyvinylpropional comprising 13.6% of vinyl acetate groups, 9.8% of vinyl alcohol groups and 76.6% of vinylpropional groups and 70 parts by weight of 1-methoxy-2-propanol.

The results obtained with this material corresponded essentially to those of Table 2. The polymer added had no effect on the dot enlargement.

EXAMPLE 6

The procedure of Example 1 was followed, except that a pigment layer solution having the following composition was used:

40 parts by weight of the $TiO_2$ pigment stated in Example 1, 10 parts by weight of a polymer having an acid number of 40, prepared by reacting 50 parts by weight of a polyvinylbutyral having a molecular weight of 70,000 to 80,000, which contained 71% of vinylbutyral units, 2% of vinyl acetate units and 27% of vinyl alcohol units, with 4 parts by weight of maleic anhydride and 50 parts by weight of butanone.

The results obtained with this material corresponded essentially to those of Table 2. The polymer added had no effect on the dot enlargement.

EXAMPLE 7

The procedure of Example 1 was followed, except that a pigment layer solution having the following composition was used:

49.95 parts by weight of the $TiO_2$ pigment stated in Example 1, 0.05 part by weight of a bluish violet toner (Tint Ayd® UL 20-12) and 50.00 parts by weight of 1-methoxyprop-2-yl acetate.

The results obtained with this material corresponded essentially to those of Table 2. The toner added had no effect on the dot enlargement.

EXAMPLES 8–13

The procedure of Example 1 was followed, except that pigment layers each having a dry weight of 3, 6, 10, 16, 20 and 26 g/m² were applied and a control using no pigment layer was prepared in accordance with Example 1. The resulting percent dot area was measured using the reflected-light densitometer stated in Example 1.

Table 3 shows the dot enlargement (in %) of the color cyan in the 40% field of the Ugra test wedge (60-line screen), measured first as a single color in the image in primary colors and then in the four-color proof, i.e. at a point where the cyan wedge was still covered by the adhesion-promoting layers of the other three images in primary colors.

TABLE 3

| Layer Weight | Cyan as a single color | Cyan in four-color image |
| --- | --- | --- |
| 0 g/m$^2$ | 15 | 21 |
| 3 g/m$^2$ | 12 | 18 |
| 6 g/m$^2$ | 10 | 17 |
| 10 g/m$^2$ | 9 | 17 |
| 16 g/m$^2$ | 7 | 15 |
| 20 g/m$^2$ | 7 | 16 |
| 26 g/m$^2$ | 6 | 15 |

EXAMPLES 14–26

The procedure of Examples 1–13 was followed, except that in each case an adhesion-promoting layer having a dry weight of about 18 g/m$^2$ was applied. The results obtained with these materials corresponded essentially to those of Examples 1–13. The thickness of the adhesion-promoting layer did not materially affect the dot enlargement.

EXAMPLES 27–52

The procedure of Examples 1–26 were carried out, except that in each case an adhesion-promoting layer solution having the following composition was used:

10 parts by weight of copolymer of styrene and butadiene (about 80% of styrene and 20% of butadiene), 90 parts by weight of toluene.

The results obtained with these materials corresponded essentially to those of Examples 1 to 26. The type of adhesion-promoting layer had little or no effect on the dot enlargement.

EXAMPLES 53–78

The procedure of Examples 1–26 were followed, except that in each case an adhesion-promoting layer solution having the following composition was used:

10 parts by weight of polyvinyl acetate (MW 110,000; Tg 28° C.) and 90 parts by weight of butyl acetate.

The results obtained with these materials corresponded essentially to those of Examples 1–26. The type of adhesion-promoting layer had little or no effect on the dot enlargement.

EXAMPLE 79

A release layer which had a dry weight of 0.7–1.0 g/m$^2$ was applied to a 50 μm thick film of polyethylene terephthalate as a temporary support. The solution was applied by means of a knife coater and dried at 100° C. in a drying oven for 3 minutes.

Coating solution A 120 parts by weight of polyvinyl alcohol (Pw=530, degree of hydrolysis 88 mol %), 120 parts by weight of polyvinyl alcohol (Pw=1000, degree of hydrolysis 88 mol %), 6.7 parts by weight of nonylphenol polyglycol ether and 6800 parts by weight of demineralized water.

In the following step, the colored photosensitive layer was applied to the release layer with the aid of a spin coater. The coating solutions for the photosensitive layer were prepared in two stages:

Coating solution B (pigment dispersion)

5.5 parts by weight of polyvinylpropional as in Example 5, 6.5 parts by weight of Hostaperm Blue B2G (C.I. 74160), 44 parts by weight of propylene glycol monomethyl ether and 44 parts by weight of γ-butyrolactone.

Coating solution C 12.5 parts by weight of polypyrocatechol monomethacrylate (RSV: 0.210 in dimethylformamide), 6.5 parts by weight of coating solution B, 1.1 parts by weight of an esterification product of 1 mol of 2,3,4-trihydroxybenzophenone and 3 mol of 1,2-naphthoquinone-2-diazide- 4-sulfonic acid, 36.4 parts by weight of propylene glycol monomethyl ether and 43.5 parts by weight of tetrahydrofuran.

The solution was applied by spin-coating to the film provided with the release layer, in such a way that a layer weight of 1.5 g/m$^2$ was obtained after drying (2 minutes, 110° C.). The color density, measured with a Gretag densitometer through a blue filter, was 1.2.

Finally, an adhesion-promoting layer comprising 97% by weight of a styrene/butadiene copolymer (Tg=50° C.) and by weight of a polyester (Desmophen® 1700, BAYER AG), having a dry weight of 3 g/m$^2$, was furthermore applied to the photosensitive layer.

The color proofing film thus obtained was laminated, on the adhesion-promoting layer, with a receiving sheet, which was provided, as described in Example 1, with a white layer. After the lamination, the support film was peeled off. The adhesion-promoting layer and the colored photosensitive layer remained behind on the receiving sheet.

The photosensitive layer was then exposed imagewise to a UV light source through a photomask in a vacuum copying frame in a known manner and was developed with an aqueous alkaline solution which comprised 92 parts by weight of water, 3 parts by weight of sodium octanesulfate, 3 parts by weight of potassium metasilicate, 1 part by weight of phenoxyethanol and 1 part by weight of trisodium phosphate, those parts of the layer exposed to the light and the total release layer being removed. The steps described were repeated with the remaining colors.

With the material and process of this example, too, the dot enlargement was of the same order of magnitude as in the case of the materials of Example 1.

The invention has been described with reference to examples of particularly preferred embodiments. Those skilled in the art will appreciate that various modifications may be made to the present invention without departing from the spirit and scope thereof.

What is claimed is:

1. A process for the production of a color image, comprising:

(a) laminating a photosensitive material that has a temporary support film, a colored photosensitive layer and an adhesion-promoting layer which can be activated by heat at high temperature and under pressure with an image-receiving material comprising a support, and a pigment layer containing a white pigment, wherein the pigment layer containing the white pigment is transferred from a temporary support film to the image-receiving support material by lamination under pressure and heat;

(b) exposing imagewise the photosensitive layer;

(c) developing the exposed photosensitive layer to produce an image; and (d) peeling the temporary support film off from the image-receiving material after exposure to light, wherein the image is developed by peeling apart the temporary support film and the image-receiving material.

2. A process as claimed in claim 1, wherein the pigment layer of the image-receiving material further contains a polymeric binder.

3. A process as claimed in claim 1, wherein the image-receiving material comprises, between the support and the pigment layer, an adhesion-promoting layer which can be activated by heat.

4. A process as claimed in claim 1, wherein a multi-color image is prepared by carrying out steps (a) through (d) for a first color, and then repeating steps (a) through (d) for each subsequent color.

5. A process as claimed in claim 4, wherein each subsequent color is imagewise exposed in register with the first color.

6. A process for the production of a color image, comprising:

(a) laminating a photosensitive material that has a temporary support film, a colored photosensitive layer and an adhesion-promoting layer which can be activated by heat at high temperature and under pressure with an image-receiving material comprising a support, and a pigment layer containing a white pigment, wherein the pigment layer containing the white pigment is transferred from a temporary support film to the image-receiving support material by lamination under pressure and heat;

(b) exposing imagewise the photosensitive layer;

(c) peeling the temporary support film off from the image-receiving material before or after exposure to light, and (d) developing the exposed photosensitive layer to produce an image;

wherein the temporary support film is peeled off from the photosensitive layer, and the image is developed by washing out the exposed photosensitive layer with a developer.

7. A process as claimed in claim 6, wherein the pigment layer of the image-receiving material further contains a polymeric binder.

8. A process as claimed in claim 6 wherein the image-receiving material comprises, between the support and the pigment layer, an adhesion-promoting layer which can be activated by heat.

9. A process as claimed in claim 6, wherein the temporary support film is peeled off before exposure to light.

10. A process as claimed in claim 6, wherein a multi-color image is prepared by carrying out steps (a) through (d) for a first color, and then repeating steps (a) through (d) for each subsequent color.

11. A process as claimed in claim 10, wherein each subsequent color is imagewise exposed in register with the first color.

* * * * *